United States Patent [19]
Takeuchi

[11] Patent Number: 5,897,599
[45] Date of Patent: Apr. 27, 1999

[54] CONTROL SYSTEM FOR A VEHICLE SAFETY DEVICE WITH EEPROM MEMORY FOR STORING GAIN

[75] Inventor: Kunihiro Takeuchi, Saitama-Ken, Japan

[73] Assignee: Airbag Systems Company, Ltd., Tomioka, Japan

[21] Appl. No.: 07/883,162

[22] Filed: May 15, 1992

[30] Foreign Application Priority Data

May 29, 1991 [JP] Japan ................................ 3-154091

[51] Int. Cl.$^6$ ................................................ B60R 21/32
[52] U.S. Cl. ................................................ 701/46
[58] Field of Search ................ 364/424.05; 371/67.1, 371/2.1, 21.2, 24, 71; 307/10.1; 73/488, 900; 180/170

[56] References Cited

U.S. PATENT DOCUMENTS

| | | | |
|---|---|---|---|
| 4,497,025 | 1/1985 | Hannoyer | 364/424.05 |
| 4,943,923 | 7/1990 | Naito | 180/170 |
| 4,982,805 | 1/1991 | Naitou et al. | 180/170 |
| 5,083,276 | 1/1992 | Okano et al. | 364/424.05 |
| 5,166,935 | 11/1992 | Bish | 371/67.1 |
| 5,182,459 | 1/1993 | Okano et al. | 364/424.05 |
| 5,200,963 | 4/1993 | Chau et al. | 371/67.1 |

FOREIGN PATENT DOCUMENTS

| | | | |
|---|---|---|---|
| 0090000 | 7/1980 | Japan | 371/67.1 |
| 0059358 | 5/1981 | Japan | 371/67.1 |
| 0196605 | 11/1983 | Japan | 73/900 |
| 60-244649 | 12/1985 | Japan . | |
| 269641 | 10/1989 | Japan . | |
| 193743 | 7/1990 | Japan . | |
| 259902 | 10/1990 | Japan . | |
| 3-43058 | 4/1991 | Japan . | |

OTHER PUBLICATIONS

"Handbook on Processing of Information," Kabushiki Kaisha Omu, Tokyo, Japan (Mar. 30, 1986) (no translation).

*Primary Examiner*—Kevin J. Teska
*Assistant Examiner*—Russell W. Frejd
*Attorney, Agent, or Firm*—Fish & Richardson P.C.

[57] ABSTRACT

A system for controlling an object such as a vehicle safety device, comprises an EEPROM. A microcomputer is operated to multiply a sensing data such as acceleration by a gain in order to correct it, and control the object based on the corrected sensing data. The EEPROM has three or more memory areas of a first group, and the same number of memory areas of a second group. Numerical values equal to each other are written respectively into the first group memory areas as the gain, and complementary numerical values of the numerical values representing the gain are written respectively into the second group memory areas. The microcomputer is operated to check the data in the EEPROM. An alarm device is actuated when the microcomputer detects that the data is abnormal. A numerical value which belongs to majority in the first group memory areas in the EEPROM, and which is also in complementary relation with a complementary numerical value belonging to majority in the second group memory areas, is selected so as to be used as a proper gain.

1 Claim, 4 Drawing Sheets

CONTROL SYSTEM FOR A VEHICLE SAFETY DEVICE WITH EEPROM MEMORY FOR STORING GAIN

BACKGROUND OF THE INVENTION

This invention relates to a control system for a vehicle safety device or the like.

As disclosed in Japanese Laid-Open (Kokai) Patent Application No. 193743/1990, a control system for an air bag (vehicle safety device) comprises an acceleration sensor, an amplifier for amplifying an output of the acceleration sensor, an analog-to-digital converter (ADC) for converting the amplified acceleration signal to a digital signal, and a microcomputer for receiving the acceleration signal from the ADC and effecting an acceleration evaluation. The microcomputer receives the acceleration signal at a predetermined cycle, and integrates it, and compares this integral value with a threshold value. This integral value represents a change in vehicle speed, and increases in the decelerating direction when a collision has occurred. When the integral value increases in the decelerating direction and exceeds the threshold value, the microcomputer judges that a collision has occurred, and outputs a trigger signal, thereby expanding the air bag.

In general, an output of each acceleration sensor of the type used in the above control system was irregular, and was required to be corrected individually. Although not disclosed in the above Patent application, heretofore, the output of the acceleration sensor was compared with that of a reference sensor, and a gain of the amplifier was adjusted based on a result of the comparison, so that the acceleration signal of the former inputted into the microcomputer would be identical with that of the latter, so that the acceleration evaluation can be effected with high accuracy.

Recently, a system using an EEPROM has been developed in order to effect the gain adjustment comparatively simply and accurately. Specifically, in this system, a gain corresponding to an output characteristic of the acceleration sensor is written into a predetermined memory area of the EEPROM. The acceleration from the acceleration sensor is multiplied by the gain so as to be corrected, and the acceleration evaluation is effected based on this corrected acceleration. Although the above EEPROM is capable of storing data stably, the data stored in the EEPROM are threatened with a possible breakage after the passage of a long period of time, and therefore a counter-measure for the possible breakage is demanded.

As the prior art relating to the present invention, Japanese Laid-Open (Kokai) Patent Application No. 259902/1990 discloses a data storing device for a vehicle control system, and it also discloses, as one specific example, a device for storing a gain of vehicle speed in a constant-run control system. In this storing device, the gain of the vehicle speed can be rewritten while the vehicle is in a running condition. This storing device includes first to fourth memories, each of 8 bits. Identical data, as the gain, are stored in the first and third memories, and their complementary numerical values (inverse numerical values) are stored in the second and fourth memories. The microcomputer receives the vehicle speed and multiplies the vehicle speed by this gain to obtain a corrected vehicle speed. The gain is determined as follows. First, the data in the first memory and the data in the second memory are read, and then it is judged whether or not these data are in complementary relation. If the judgment result is "YES", the data in the first memory is used as the gain. In contrast, if the judgment result is "NO", it is then judged whether or not the data in the third and fourth memories are in complementary relation. If the judgment result is "YES", the data in the third memory is used as the gain. In contrast, if the judgment result is "NO", the data in all memories are initialized.

In the system of the above Laid-Open Patent Application No. 259902/1990, the gain is adjusted in accordance with a running condition of the vehicle (vehicle speed), and therefore the system is different in a premised technique from the present invention which relates to the storage of the gain for acceleration. In the present invention, the identical data are stored in the EEPROM for a long period of time as a premised technique. In the above Laid-Open Patent Application No. 259902/1990, only when at least one pair of data are in complementary relation, one of the pair of data is used as the gain and therefore reliability is low.

Japanese Laid-Open Patent Application No. 269641/1989 discloses, as another related prior art to the present invention, a device for storing a failure judgment data of an air bag controlling system. This storing device comprises a non-volatile memory (NVRAM), into which the failure judgment data of the air bag device is written. This storing device has three or more of memory areas A, B, and C. Each of the memory areas A, B, and C is of 8 bits. The failure judgment data is written into the memory area A, and an identical failure judgment data (but shifted or rotated by one bit with respect to the data in the memory area A) is written into the memory area B. Another identical failure judgment data (but further shifted or rotated by another one bit with respect to the data in the memory area B) is written into the memory area C. Then, the failure judgment data in all these memory areas are read, and then it is judged whether or not all of these data are identical with each other. If the judgment result is "NO", an alarm device is actuated in order to indicate that the storing device is subjected to a failure. At the same time, failure data are determined by the rule of majority.

The above Laid-Open Patent Application No. 269641/1989 relates to the device for storing a failure judgment data of an air bag controlling system, and therefore is different in a premised technique from the present invention. According to the present invention, it is a premised technique which relates to the storage of gain for acceleration from the sensor and this gain is stored in the EEPROM. In the Laid-Open Patent Application No. 269641/1989, data is determined merely by a majority, and therefore reliability of the data is low.

SUMMARY OF THE INVENTION

It is therefore an object of the present invention to provide a control system, in which even if a part of data (including a gain) stored in an EEPROM has been broken, a highly accurate control can be effected using the remaining data as the gain, and reliability of this gain can be increased.

It is another object of the invention to provide a control system, which is applicable to a vehicle safety device.

According to one aspect of the present invention, there is provided a control system comprising:

(a) a sensor for outputting a sensing data;
(b) correction means for multiplying the sensing data by a gain in order to correct it;
(c) an EEPROM, numerical values equal to each other being written, as the gain, into three or more memory areas of a first group in the EEPROM, complementary numerical values of the numerical values representing the gain being written respectively into the same number of memory areas of a second group in the EEPROM;

(d) control means for controlling an object based on the corrected sensing data;

(e) data checking means for judging whether or not the numerical values representing the gain, stored in the first group memory areas in the EEPROM are equal to each other, and judging whether or not the complementary numerical values stored in the second group memory areas are equal to each other, and further judging whether or not the numerical values representing the gain, stored in the first group memory areas are in complementary relation with the complementary numerical values stored in the second group memory areas;

(f) alarm instruction means for actuating an alarm device when the data checking means makes at least one negative judgment; and (g) gain setting means for selecting a numerical value which belongs to majority among all the numerical values representing the gain, stored in the first group memory areas in the EEPROM, and which is also in complementary relation with a complementary numerical value belonging to the majority among the complementary values stored in the second group memory areas, and providing such selected numerical value, as a proper gain, to the correction means.

According to another aspect of the invention, there is provided a control system for a vehicle safety device comprising:

(a) an acceleration sensor for detecting acceleration of a vehicle;

(b) acceleration correction means for multiplying the acceleration from the acceleration sensor by a gain in order to correct it;

(c) an EEPROM, numerical values equal to each other being written, as the gain, into three or more memory areas of a first group in the EEPROM, complementary numerical values of the numerical values representing the gain being written respectively into the same number of memory areas of a second group in the EEPROM;

(d) acceleration evaluation means for judging whether or not a collision of the vehicle has occurred based on such corrected acceleration, and outputting a trigger signal to the vehicle safety device when the judgment result is "YES";

(e) gain setting means for setting the gain, the gain setting means including (i) first means for means for judging whether or not the numerical values representing the gain, stored in the first group memory areas in the EEPROM are equal to each other, and further preliminarily determining the numerical value belonging to the majority among all the numerical values representing the gain as a temporary proper gain, (ii) second means for judging whether or not the complementary numerical values stored in the second group memory areas are equal to each other, and preliminarily determining the complementary numerical value belonging to the majority among all the complementary numerical values, and (iii) third means for judging whether or not the temporary proper gain is in complementary relation with the complementary numerical values belonging to the majority, and determining the temporary proper gain as a proper gain under the condition that the third means makes an affirmative judgment, and further providing the proper gain to the correction means; and;

(f) alarm instruction means for actuating an alarm device when the gain setting means makes at least one negative judgment

DETAILED DESCRIPTION OF THE INVENTION

Figure 1:
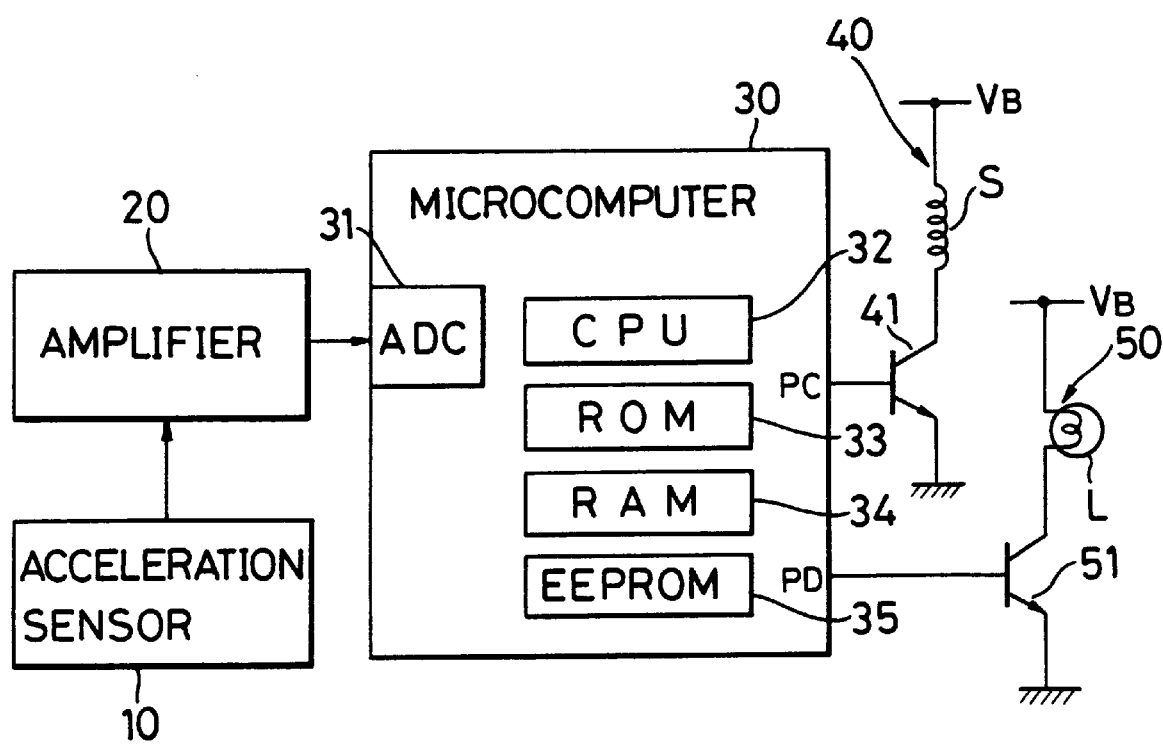
FIG. 1 is a circuit diagram schematically showing one embodiment of a control system according to the present invention.

One embodiment of the present invention will now be described with reference to FIGS. 1 through 4. FIG. 1 shows a general construction of a control system for controlling a squib S of an air bag (vehicle safety device). The control system comprises an acceleration sensor 10 for detecting the acceleration of the vehicle in both the accelerating and decelerating directions, an amplifier 20 for amplifying an acceleration signal from the acceleration sensor 10, a microcomputer 30 for processing the amplified acceleration signal, a drive circuit 40 for driving the squib S under the control of the microcomputer 30, and another driving circuit 50 for actuating an alarm lamp (alarm device) L.

The microcomputer 30 is of a one-chip type, and comprises an analog-to-digital converter (ADC) 31 for converting the acceleration signal from the amplifier 20 to a digital signal, a CPU (central processing unit) 32, a ROM (read only memory) 33, a RAM (random access memory) 34, and an EEPROM (electrically erasable, programmable ROM) 35. Stored in the ROM 33 are threshold data as well as program data. On the other hand, calculated or processed data, etc. are written, from time to time, into the RAM 34.

In the EEPROM 35, numerical values FAC1, FAC2, and FAC3, as will be described, are written into its memory areas having address Nos. 1, 2, and 3. At the beginning when these numerical values FAC1, FAC2, and FAC3 are written, they represent proper gains, respectively, these proper gains being determined in accordance with an output characteristic of the acceleration sensor 10, and are equal to each other. Again in the EEPROM 35, complementary numerical values COM1, COM2, and COM3, which are in complementary relation with the corresponding FAC1, FAC2, and FAC3, are written into its memory areas having address Nos. 4, 5, and 6. These complementary numerical values COM1, COM2, and COM3 are also equal to each other at the beginning when they are written. The data stored in the EEPROM 35 are threatened with a possible breakage after a long time use thereof. Once completely broken, the numerical values FAC1, FAC2, and FAC3 do not represent the proper gains any more. Similarly, the complementary numerical values COM1, COM2, and COM3 are no more in the complementary relation with the numerical values representing the proper gains.

The microcomputer 30 further comprises an output port PC for outputting a trigger signal when a collision judgment is made, as will be described, and another output port PD for outputting an alarm signal when it is judged that at least a part of the data stored in the EEPROM 35 is abnormal.

The drive circuit 40 comprises an emitter-grounded transistor 41, and the squib S is connected between a collector of this transistor 41 and a battery $V_B$. When the trigger signal of a high level is outputted from the output port PC, the transistor 41 is turned on to ignite the squib S, thereby expanding the air bag.

The drive circuit 50 comprises an emitter-grounded transistor 51, and an alarm lamp L is connected between a collector of this transistor 51 and the battery $V_B$. When the alarm instruction signal of a high level is outputted from the output port PD, the transistor 51 is turned on to actuate the alarm lamp L, thereby telling the driver that at least a part of the data stored in the EEPROM 35 is abnormal.

The microcomputer 30 executes a timer interrupt routine at a predetermined cycle. In this timer interrupt routine, first, an acceleration signal G is read from the ADC 31. Next, a corrected acceleration G' is obtained from the following equation;

$$G'=G\sim(1+\alpha)$$

wherein α represents a gain. The gain α here is determined in accordance with a program as will be described hereinafter. It is then judged whether or not an acceleration integral value ΔV increases in the decelerating direction and exceeds a threshold level Th. If the judgment result is "YES", the trigger signal of a high level is outputted from the output port PC to ignite the squib S, thereby expanding the air bag. In contrast, if the judgment result is "NO", the program returns to the main routine without expanding the air bag.

Figure 2:
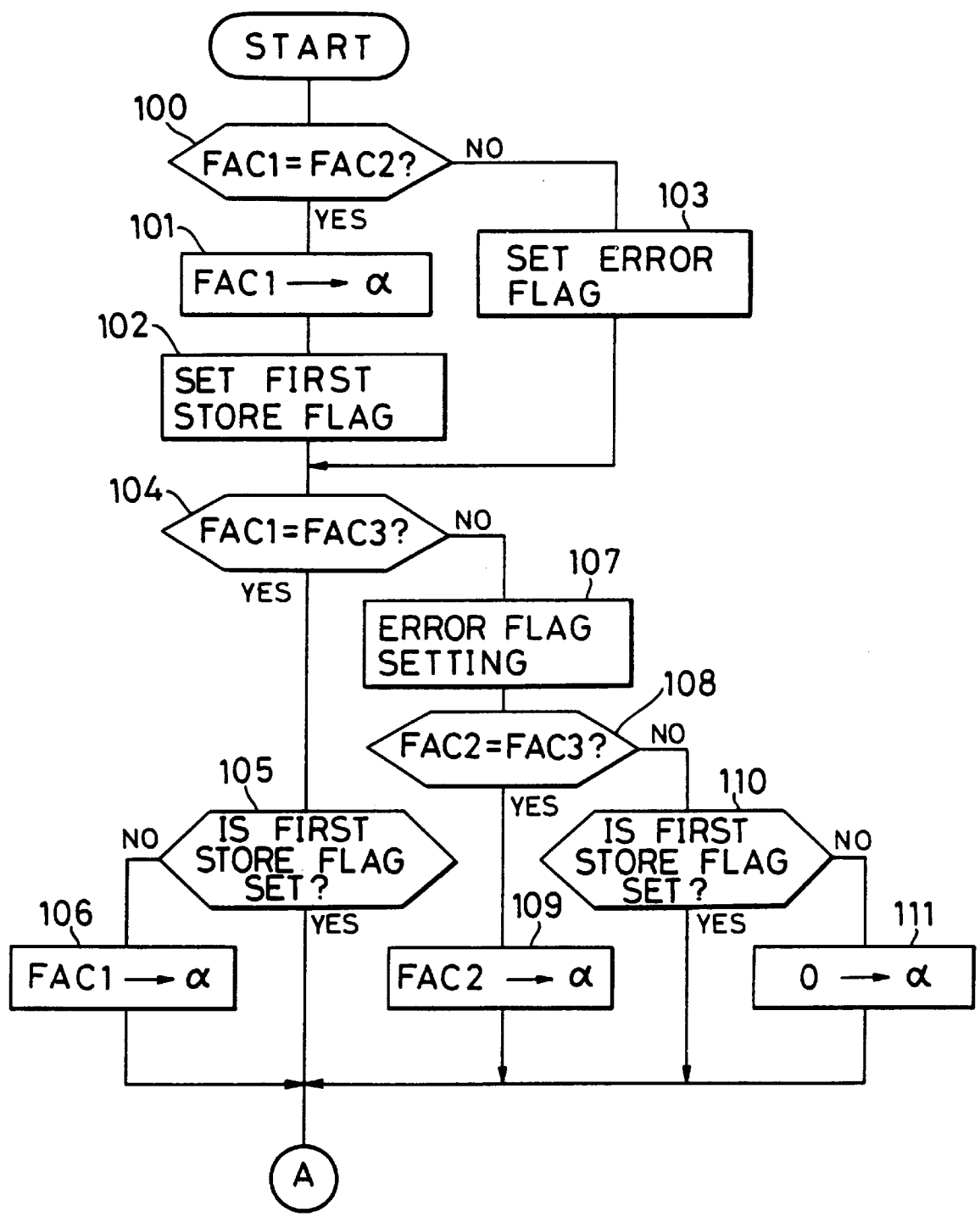
FIG. 2 is a flow chart showing an early portion or stage of a routine for checking an EEPROM and determining a gain, this routine being executed by the microcomputer of FIG. 1.

Next, there will be described the data checking of the EEPROM 35 as well as a gain setting, which are executed in the main routine. First, as is shown in FIG. 2, a checking is made on the numerical values FAC1, FAC2, and FAC3 which represent the gains, respectively, and a numerical value belonging to majority is selected (preliminary determination of the gain). More specifically, it is judged whether or not the numerical value FAC1 stored in the memory area having the address No. 1 is in agreement with the numerical value FAC2 stored in the memory area having the address No. 2 (Step 100). If the judgment result is "YES", the gain α is preliminarily determined to the FAC1 (Step 101), and then a first store flag is set (Step 102). The first store flag thus set indicates the fact that the numerical value FAC1 stored in the memory area having the address No. 1 is equal to the numerical value FAC2 stored in the memory area having the address No. 2.

If the judgment result in Step 100 is "NO", an error flag is set (Step 103), and then the Steps 101 and 102 are skipped. The error flag thus set indicates the fact that at least a part of the data of the numerical values FAC1, FAC2, and FAC3 stored in the memory areas having the address Nos. 1 to 6 in the EEPROM 35 and their complementary numerical values COM1, COM2, and COM3, is broken.

After executing the above Step 102 or 103, it is judged whether or not the numerical value FAC1 stored in the memory area having the address No. 1 is in agreement with the numerical value FAC3 stored in the memory area having the address No. 3 (Step 104). If the judgment result in Step 104 is "YES", it is then judged whether or not the first flag is set (Step 105). If the judgment result in Step 105 is "NO" (that is, it is judged that the FAC1 and FAC3 stored in the memory areas having the address Nos. 1 and 3 remain unbroken, and that only the numeral value FAC2 stored in the memory area having the address No. 2 is broken), the gain α is preliminarily determined to the numerical value FAC1 (Step 106).

In contrast, if the judgment result in Step 105 is "YES" (that is, it is judged that the numerical values FAC1, FAC2, and FAC3 stored in the memory areas having the address Nos. 1 to 3 all remain unbroken), the Step 106 is skipped. The reason is that the gain α is already preliminarily determined to the numerical value FAC1 in the above Step 101.

If the judgment result in Step 104 is "NO", the error flag is set (Step 107), and then judges whether or not the numerical values FAC2 and FAC3 stored in the memory areas having the address Nos. 2 and 3 are in agreement with each other (Step 108). If the judgment result in Step 108 is "YES" (that is, it is judged that the numerical values FAC2 and FAC3 stored in the memory areas having the address Nos. 2 and 3 remain unbroken, and that only the numerical value FAC1 stored in the memory area having the address No. 1 is broken), the gain α is preliminarily determined to the numerical value FAC2 (Step 109).

In contrast, if the judgment result in Step 108 is "NO", it is then judged whether or not the first store flag is set (Step 110). If the judgment result in Step 110 is "NO" (that is, it is judged that the numerical values FAC1, FAC2, and FAC3 stored in the three memory areas having the address Nos. 1 to 3 are different from each other, and that all of them should be presumed to be broken), the gain α is set to zero (Step 111). If the judgment result in Step 110 is "YES" (that is, it is judged that the numerical values FAC1 and FAC2 stored in the memory areas having the address Nos. 1 and 2 remain unbroken, and that only the numerical value FAC3 stored in the memory having the address No. 3 is broken), the Step 111 is skipped. In this case, the gain α is already preliminarily determined to the numerical value FAC1 in the above Step 101.

Figure 3:
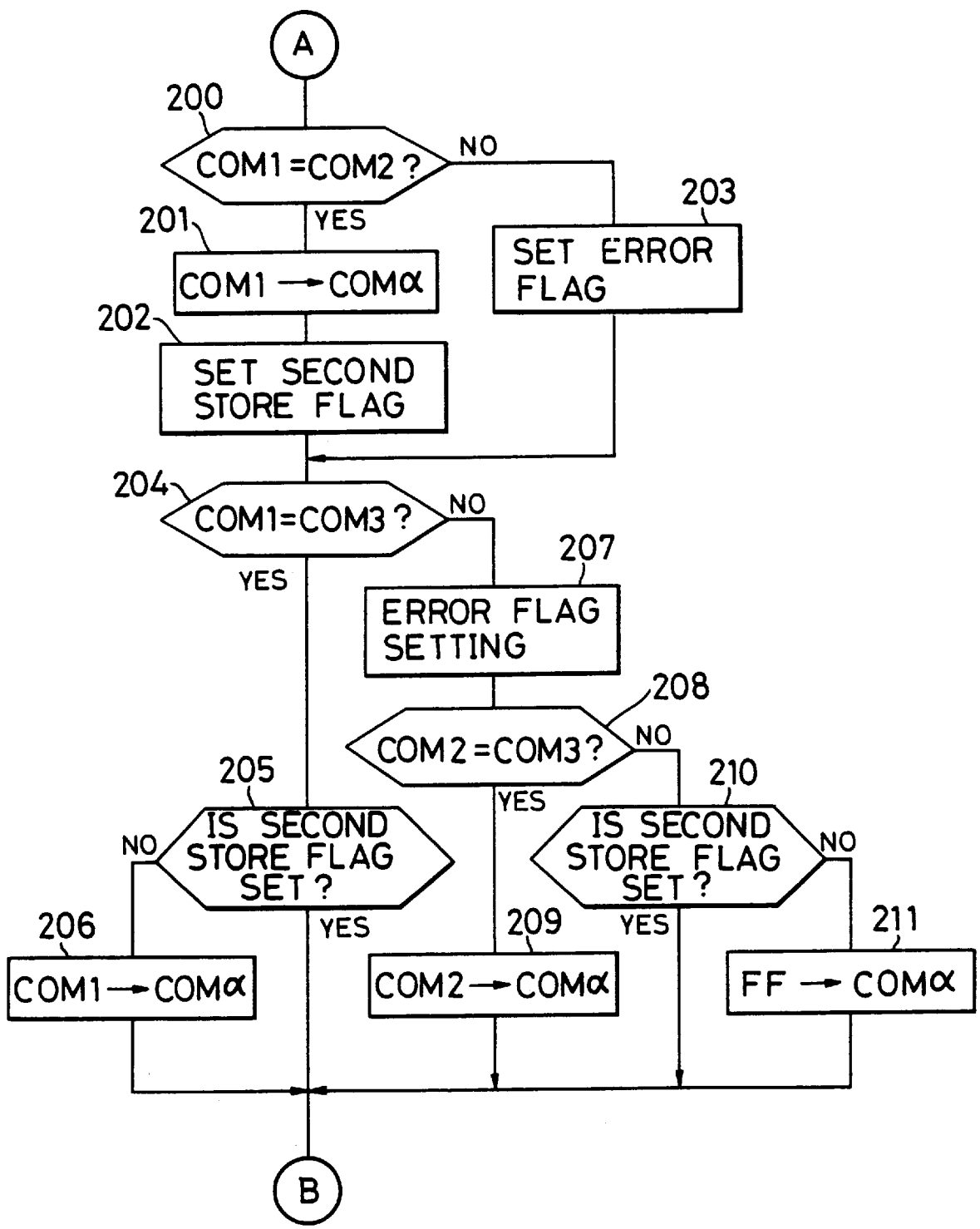
FIG. 3 is likewise a flow chart, but showing an intermediate portion or stage of the above routine which is executed after the early portion or stage of FIG. 2 is executed.

Subsequently, as is shown in FIG. 3, the complementary numerical values COM1, COM2, and COM3 are checked, and a complementary numerical value (complementary numerical value belonging to majority) to be compared with the preliminarily determined gain is selected. More specifically, it is judged whether or not the complementary numerical value COM1 stored in the memory area having the address No. 4 is in agreement with the complementary numerical value COM2 stored in the memory area having the address No. 5 (Step 200). If the judgment result in Step 200 is "YES", the complementary numerical value COM1 is selected as a majority complementary numerical value (complementary numerical value belonging to majority) COMα (Step 201), and then a second store flag is set (Step 202). The second store flag thus set indicates the fact that the complementary numerical value COM1 stored in the memory area having the address No. 4 is equal to the complementary numerical value COM2 stored in the memory area having the address No. 5. If the judgment result in Step 200 is "NO", the error flag is set (Step 203), and then the Steps 201 and 202 are skipped.

After executing the Step 202 or 203, it is judged whether or not the complementary numerical value COM1 stored in the memory area having the address No. 4 is in agreement with the complementary numerical value COM3 stored in the memory area having the address No. 6 (Step 204). If the judgment result in Step 204 is "YES", it is then judged whether or not the second store flag is set (Step 205). If the judgment result in Step 205 is "NO" (that is, it is judged that the complementary numerical values COM1 and COM3 stored in the memory areas having the address Nos. 4 and 6 remain unbroken, and that only the complementary numerical value COM2 stored in the memory area having the address No. 5 is broken), the complementary numerical value COM1 is selected as the majority complementary numerical value COMα (Step 206).

If the judgment result in Step 205 is "YES" (that is, it is judged that the complementary numerical values COM1, COM2, and COM3 stored in the memory areas having the address Nos. 4 to 6 all remain unbroken), the Step 206 is skipped. The reason is that the complementary numerical value COM1 is already selected as the majority complementary numerical value COMα in the Step 201.

If the judgment result in Step 204 is "NO", the error flag is set (Step 207), and then it is judged whether or not the complementary numerical values COM2 and COM3 stored in the memory areas having the address Nos. 5 and 6 are in agreement with respect to each other. If the judgment result is "YES (that is, it is judged that the complementary numerical values COM2 and COM3 stored in the memory areas having the address Nos. 5 and 6 remain unbroken, and that only the complementary numerical value COM1 stored in the memory area having the address No. 4 is broken), the COM2 is selected as the majority complementary numerical value COMα (Step 209).

If the judgment result in Step 208 is "NO", it is then judged whether or not the second store flag is set (Step 210). If the judgment result in Step 210 is "NO" (that is, it is judged that the complementary numerical values COM1, COM2, and COM3 stored in the three memory areas having the address Nos. 4 to 6 are different from each other, and that all of them should be presumed to be broken), "FF" (which is a complementary numerical value at α=0) is selected as the majority complementary numerical value COMα (Step 211). If the judgment result in Step 210 is "YES" (that is, it is judged that the complementary numerical values COM1 and COM2 stored in the memory areas having the address Nos. 4 and 5 remain unbroken, and that only the complementary numerical value COM3 stored in the memory having the address No. 6 is broken), the Step 211 is skipped. In this case, the complementary numerical value COM1 is already selected as the majority complementary numerical value COMα in the above Step 201.

Figure 4:
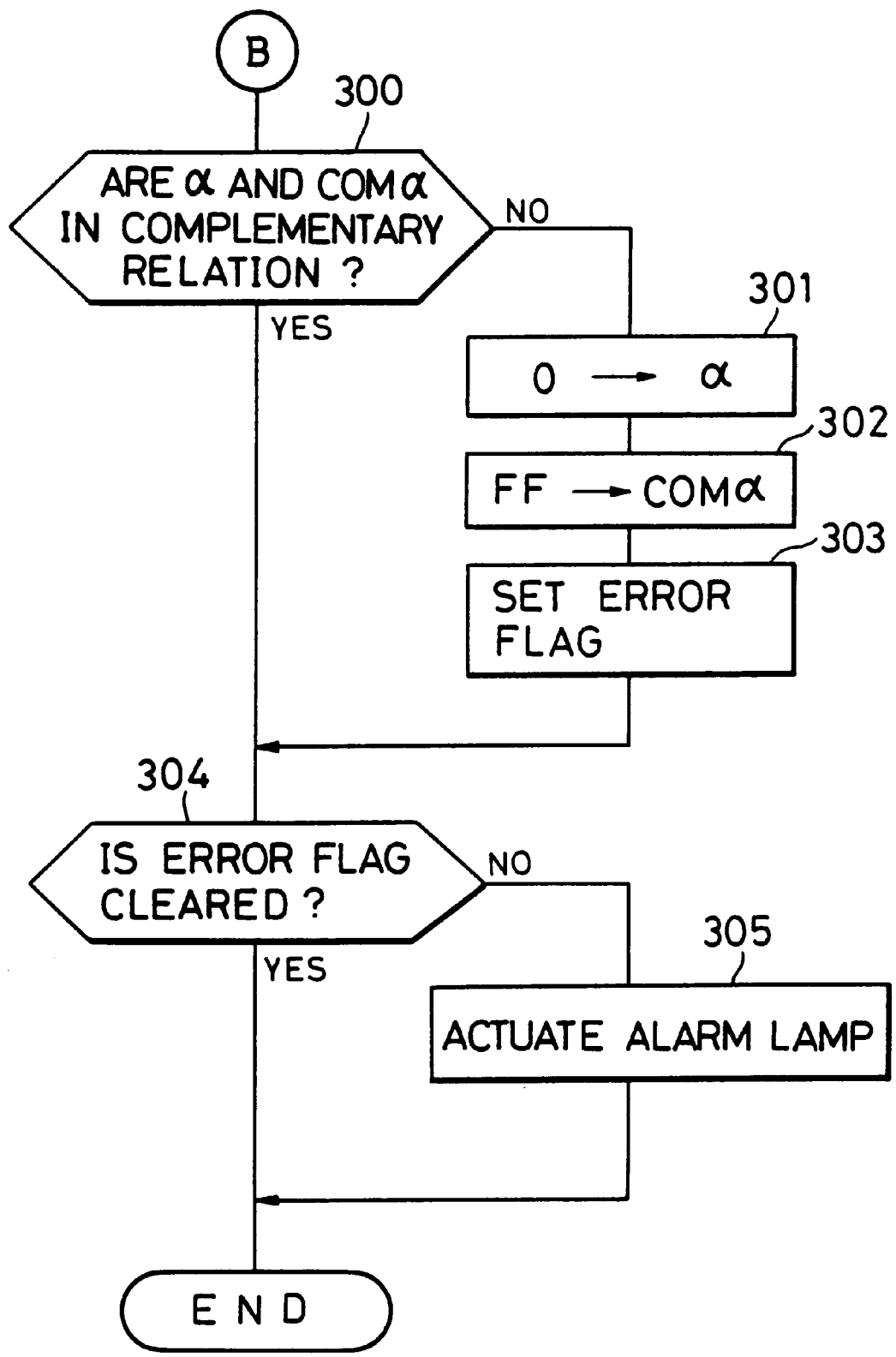
FIG. 4 is likewise a flow chart, but showing a final portion or stage of the above routine which is executed after the intermediate portion or stage of FIG. 3 is executed.

Subsequently, as is shown in FIG. 4, it is judged whether or not the preliminarily determined gain α and the majority complementary numerical value COMα are in complementary relation with respect to each other (Step 300). If the judgment result is "NO" (that is, it is judged that the preliminarily determined gain α is unreliable), the gain α is set to zero (Step 301), and the complementary numerical value COMα to be compared is set to "FF" (Step 302), and then the error flag is set (Step 303). If the judgment result in Step 300 is "YES" (that is, it is judged that the preliminarily determined gain α is reliable), the Steps 301 to 303 are skipped. In this way, the gain α is formally determined, and used in the aforementioned calculation for correcting the acceleration speed.

Subsequently, it is judged whether or not the error flag is in a cleared condition (Step 304). If the judgment result is "NO", the alarm instruction signal of a high level is outputted from the output port PD in order to actuate the alarm lamp L (Step 305), thereby telling the driver that at least a part of the data stored in the EEPROM 35 is broken. If the judgment result in Step 304 is "YES", the Step 305 is skipped.

Noticing the actuation of the alarm lamp L, the driver makes an arrangement for repair. In this repair, the proper gains and their complementary numerical values can be rewritten into the EEPROM 35. The present invention pays attention to the fact that the breakage of the data in the EEPROM 35 is progressed gradually, and not all at once. Specifically, even if a part of the numerical values stored in three or more of the addresses is broken, there is a good possibility that the remaining values belonging to majority still represent the proper gains. In this case, the acceleration evaluation can be effected with high accuracy by correcting the acceleration using these remaining majority values as the proper gains, irrespective of the fact that breakage of the data in the EEPROM 35 is already started. Moreover, reliability of such obtained gains is very high because these remaining majority values are selected under the condition that they are in complementary relation with complementary numerical values belonging to majority.

The present invention is not limited to the above embodiments, and various modifications can be made. For example, first, comparisons are made between the numerical value FAC1 and its complementary numerical value COM1, between the numerical value FAC2 and its complementary numerical value COM2, and between the numerical value FAC3 and its complementary numerical value COM3, respectively. Then the numerical values satisfying the complementary relation are compared with each other in order to select a majority numerical values as the gain.

In the EEPROM, numerical values representing proper gains (which are equal to each other), respectively, may be written in 4 or more (for example, 10) of its memory areas. Also in this case, the numerical values to be served as the proper gains are determined by the rule of majority. Even in the case where breakage of data of numerical values in a plurality of memory areas is undergoing, a proper gain can be selected.

The EEPROM, ADC, etc. may, of course, be external parts, instead of internal parts, of the one-chip type microcomputer.

The control system of the present invention can be applied not only to an air bag but also to a pre-tensioner of a seat belt, or other objects to be controlled.

What is claimed is:

1. A control system for a vehicle safety device comprising:

(a) an acceleration sensor for detecting acceleration of a vehicle;

(b) acceleration correction means for multiplying said acceleration from said acceleration sensor by a gain in order to correct it;

(c) an EEPROM, numerical values equal to each other being written, as said gain, into three or more memory areas of a first group in said EEPROM, complementary numerical values of said numerical values representing said gain being written respectively into three or more memory areas of a second group in said EEPROM;

(d) acceleration evaluation means for judging whether or not a collision of said vehicle has occurred based on such corrected acceleration, and outputting a trigger signal to said vehicle safety device when the judgement result is "YES";

(e) gain setting means for setting said gain, said gain setting means including (i) first means for judging whether or not said numerical values representing said gain, stored in said first group memory areas in said EEPROM are equal to each other, and preliminarily determining said numerical value belonging to the majority among all said numerical values representing said gain as a temporary proper gain, (ii) second means for judging whether or not said complementary numerical values stored in said second group memory areas are equal to each other, and preliminarily determining said complementary numerical value belonging to the majority among all said complementary numerical values, and (iii) third means for judging whether or not said temporary proper gain is in complementary relation with said complementary numerical value belonging to the majority, and determining said temporary proper gain as a proper gain under the condition that said third means makes affirmative judgment, and further providing said proper gain to said correction means; and (f) alarm instruction means for actuating an alarm device when said gain setting means makes at least one negative judgment.

* * * * *